United States Patent [19]
Schneider

[11] Patent Number: 5,617,029
[45] Date of Patent: Apr. 1, 1997

[54] METHOD OF MAGNET SHIMMING

[75] Inventor: Erika Schneider, Rexford, N.Y.

[73] Assignee: General Electric Company, Schenectady, N.Y.

[21] Appl. No.: 572,850

[22] Filed: Dec. 14, 1995

[51] Int. Cl.$^6$ ................................................. G01V 3/00
[52] U.S. Cl. ........................................... 324/320; 324/319
[58] Field of Search ..................................... 324/320, 319, 324/318, 307, 309

[56] References Cited

U.S. PATENT DOCUMENTS

| | | | |
|---|---|---|---|
| 4,680,551 | 7/1987 | O'Donnell et al. | 324/320 |
| 4,740,753 | 4/1988 | Glover et al. | 324/320 |
| 4,987,371 | 1/1991 | Glover et al. | 324/320 |
| 5,168,232 | 12/1992 | Glover et al. | 324/320 |
| 5,345,178 | 9/1994 | Manabe et al. | 324/319 |
| 5,373,239 | 12/1994 | Marek et al. | 324/320 |
| 5,391,990 | 2/1995 | Schmitt et al. | 324/319 |

*Primary Examiner*—Louis M. Arana
*Attorney, Agent, or Firm*—Lawrence P. Zale; Marvin Snyder

[57] ABSTRACT

A method is described which corrects magnetic field inhomogeneities in a magnetic resonance (MR) imaging system that takes into account the effects of a subject on the magnetic fields. A magnetic resonance sequence is applied to the subject to extract MR response signals from the subject indicating the magnetic field inhomogeneity over space. The changes of magnetic field inhomogeneity with a change in radial variable ρ (or r, in a cylindrical coordinate system) are calculated. A derivative with respect to a radial variable is calculated of a generalized 3D infinite series polynomial, such as a Legendre polynomial expressed in spherical coordinates. These inhomogeneity changes are then fit to 3D polynomial derivative to result in coefficients $[dI_c]$. Similarly coefficients of a derivative shim coil calibration matrix $[dM]$ are determined for each shim coil modeling the effect of each shim coil is on the magnetic field within the imaging volume. An inverse derivative matrix $[dM]$ is calculated to result in the inverse derivative matrix $[dM^{-1}]$. The inverse derivative matrix $[dM^{-1}]$ is multiplied by the coefficients $[dI_c]$ to determine current coefficients $[C]$ which define currents to be passed through each shim coil to correct the magnetic field inhomogeneities.

8 Claims, 2 Drawing Sheets

METHOD OF MAGNET SHIMMING

BACKGROUND OF THE INVENTION

1. Field of the Invention

This invention relates to magnetic resonance (MR) imaging and more particularly to a method of reducing magnetic field variations when a subject is in an imaging magnetic field.

2. Description of the Related Art in magnetic resonance (MR) imaging it is very important to provide a homogeneous magnetic field over an imaging volume of the subject in order to acquire accurate, non-distorted images of the subject. One such way of providing homogeneous magnetic fields is to apply a static magnetic Field with a main magnet, $B_o$, and augment the main magnetic fields with adjustment magnetic fields from auxiliary coils. These coils have shapes and current paths which add or subtract from the main magnetic field. These coils are commonly referred to as "shim" coils. The process of correcting the magnetic field inhomogeneities by passing a currents through various shim coils is known as "shimming" the magnet. The problem is, however, that these coils, and the magnetic fields produced by them, have complicated geometries, and interact with each other as well as the main magnetic field.

Measurement of field inhomogeneities when monitoring only a single resonance frequency, such as the hydrogen nuclei of water, is described in U.S. Pat. No. 4,740,753 "Magnet Shimming Using Information Derived From Chemical Shift Imaging" by Gary H. Glover, and Grant T. Gullberg, issued Apr. 26, 1988 assigned to the present assignee and hereby incorporated by reference. This patent describes shimming a magnet by identifying a matrix of magnetic field variations over space known as an inhomogeneity map.

The magnetic fields produced by an incremental current run through each of the individual shim coils are determined. Each magnetic field map is fit to a three dimensional polynomial, such as a Legendere polynomial. Next a matrix of three dimensional Legendre polynomial coefficients, describing the magnetic field produced by each of the shim coils is constructed. This matrix is termed a shim coil calibration matrix. An inverse matrix is constructed from the coil calibration matrix. The inverse matrix is matched to the measured inhomogeneity map to correct for the lowest orders of magnetic field inhomogeneity. This method ('753 patent) did not, however take into account the effects of the subject being imaged. It used a phantom with one chemical species for shimming.

The magnetic field in the imaging volume should be shimmed taking into account the effects of the subject. U.S. Pat. No. 4,987,371 by Gary H. Glover, Erika Schneider "Method for In-Vivo Shimming", issued Jan. 22, 1991 described a method of shimming the magnets taking into account the effect of the subject within the is magnet. This method, however, only corrects the lower order Legendre polynomials, and does so in Cartesian coordinates. Since each term of the polynomials corrected for provides a more accurate estimation of the magnetic field it would be advantageous to correct for higher order terms also. The '371 patent corrected for the two lowest order terms.

A similar patent, U.S. Pat. No. 5,168,232 by Gary H. Glover, Erika Schneider "Method for Rapid Magnet Shimming", issued Dec. 1, 1992, also assigned to the present assignee and incorporated by reference, describes a faster method of measuring the magnet field variation and thus decreases the time required to shim. This method ('232 patent) corrects the lowest order Legendre polynomials only for a phantom composed of a single chemical species, and not for in-vivo shimming. It does not take into account the effects of the subject on the magnetic field.

Currently there is a need for a fast method of shimming an MR magnet, taking into account effects of the subject on the magnetic field with more than one chemical species, and which corrects for higher order magnetic field inhomogeneities.

OBJECTS OF THE INVENTION

It is one object of the invention, to quickly and accurately correct for inhomogeneity in a magnetic field, taking into account the effects of a subject.

It is another object of the invention to more accurately shim the magnetic field of a magnetic resonance imaging device, taking into account the effect of the subject, to produce clearer images.

SUMMARY OF THE INVENTION

A method of rapid, in-vivo shimming of a magnetic field over a desired volume starts by acquiring an inhomogeneity map [I] being measurements of magnetic field intensity differences over a volume of a subject.

A derivative [dI] of the inhomogeneity map [I] is constructed by determining changes in magnetic field intensity with a change in the independent variable. In a 3-dimensional coordinate system, this variable is typically radial, being either r or p, depending on whether a cylindrical, spherical or elliptical coordinate system is used.

General 3 dimensional (3D) infinite series polynomials, such as Legendre polynomials, may be used to model the magnetic field inhomogeneity, and later, the shim coil fields produced. Since discontinuities occur in determining the magnetic field inhomogeneities using phase difference due to "wrap around," the derivative of the Legendre polynomial is used instead of the Legendre polynomial. The derivative with respect to p, [dL], of terms of Legendre polynomials expressed in polar coordinates is calculated and fitted to the inhomogeneity map [dI] to determine coefficients [$dI_c$] for the 3D polynomial describing the derivative inhomogeneity map.

A shim coil calibration matrix [M] describing the magnetic fields produced by each shim coil in terms of radial derivative of 3D (Legendre) polynomials is acquired. This calibration procedure is required once per magnet and need not be performed every time the magnet is shimmed.

A derivative [dM] of the matrix [M] with respect to p (or r) is determined next. An inverse derivative matrix [$dM^{-1}$] is then determined such that $[dM] \times [dM^{-1}] = 1$.

Shim current values [C] which identify correction currents required to pass through each shim coil to minimize inhomogeneity are calculated by multiplying coefficients of inhomogeneity map change [$dI_c$] by inverse derivative calibration matrix [$dM^{-1}$]. Therefore by passing the currents identified by values [C] to each respective shim coils, magnetic fields are produced by the shim coils which collectively interact with the main magnetic field to produce a magnetic field with increased homogeneity, that is, with less magnetic field variation.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description taken in conjunction with the drawings, in which:

DETAILED DESCRIPTION OF THE INVENTION

Scanner Hardware

Figure 1:
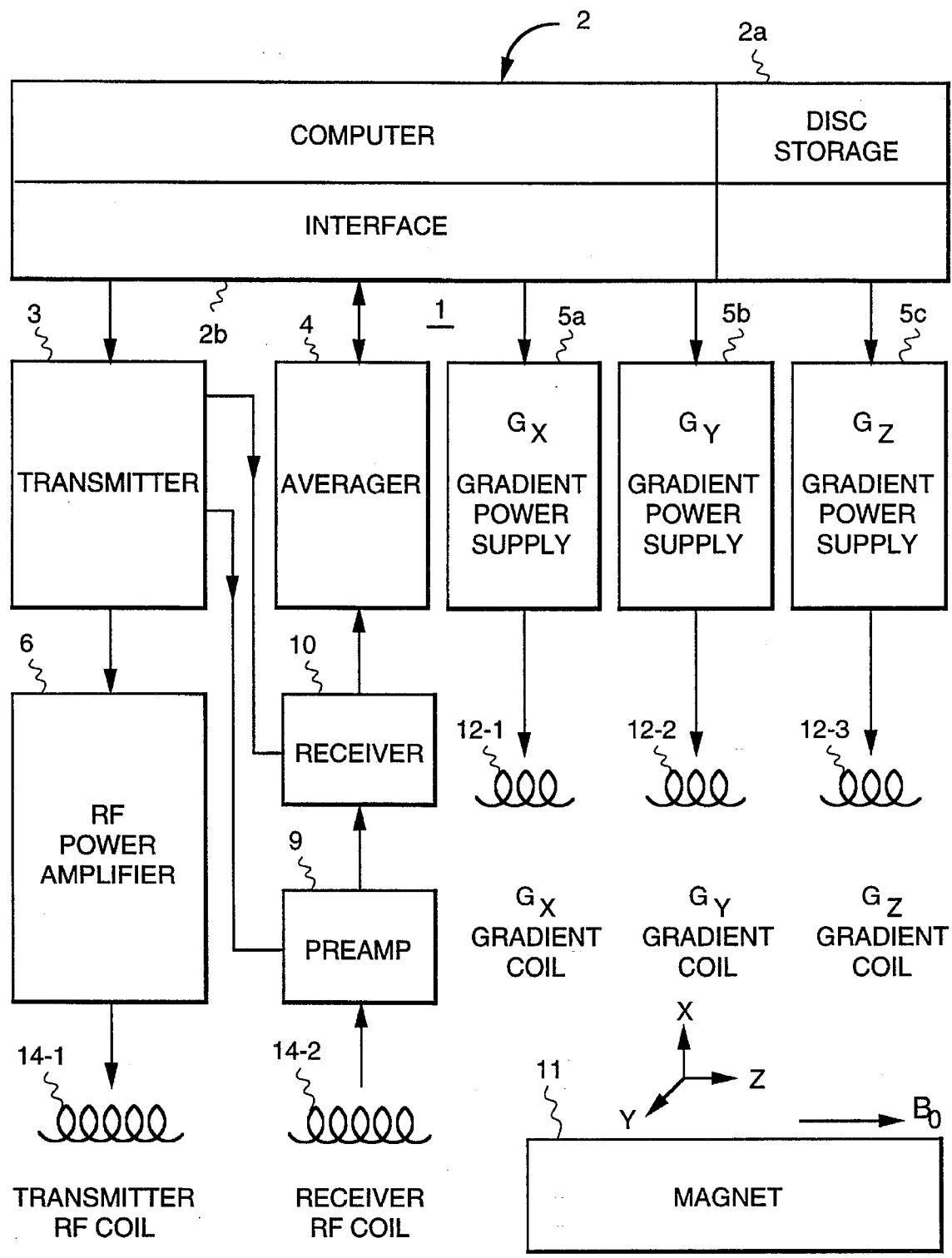
FIG. 1 is a simplified block diagram of a magnetic resonance imaging device in which the present invention may be utilized.

FIG. 1 is a simplified block diagram of the major components of a magnetic resonance (MR) imaging system suitable for use with the invention described herein. The system is made up of a general purpose mini-computer 2 which is functionally coupled to a disk storage unit 2a and an interface unit 2b. A radiofrequency (RF) transmitter 3, signal averager 4, and gradient power supplies 5a, 5b and 5c, are all coupled to computer 2 through interface unit 2b. Gradient power supplies 5a, 5b, 5c energize gradient coils 12-1, 12-2, 12-3 to create magnetic field gradients $G_x$, $G_y$, $G_z$, in the "X", "Y", "Z" directions, respectively, over a subject 10 desired to be imaged. RF transmitter 3 is gated with pulse envelopes from computer 2 to generate RF pulses having the required modulation to excite a magnetic resonance (MR) response signal from subject 10. The RF pulses are amplified in an RF power amplifier 6 to levels varying from 2 Watts to several kilowatts, depending on the imaging method, and applied RF transmit coil 14-1. The higher power levels are necessary for large sample volumes, such as in whole body imaging, and where short duration pulses are required to excite large MR frequency bandwidths in larger RF coils.

MR response signals are sensed by a receiver coil 14-2, amplified in a low noise preamplifier 9 and passed to receiver 10 for further amplification, detection, and filtering. The signal is then digitized for averaging by signal averager 4 and processed by computer 2. Preamplifier 9 and receiver 10 are protected from the RF pulses during transmission by active gating or by passive filtering.

Computer 2 provides gating and envelope modulation for the MR pulses, blanking for the preamplifier and RF power amplifier, and voltage waveforms for the gradient power supplies. The computer also performs data processing such as Fourier transformation, image reconstruction, data filtering, imaging display, and storage functions (all of which are conventional and outside the scope of the present invention).

RF transmitter coil 14-1 and receiver coil 14-2, if desired, may comprise a single coil. Alternatively, two separate coils that are electrically orthogonal may be used. The latter configuration has the advantage of reduced RF pulse breakthrough into the receiver during pulse transmission. In both cases, the coils are orthogonal to the direction of a static magnetic field $B_0$ produced by a magnet means 11. The coils may be isolated from the remainder of the system by enclosure in an RF shielded cage.

Shim Coils

Figure 2:
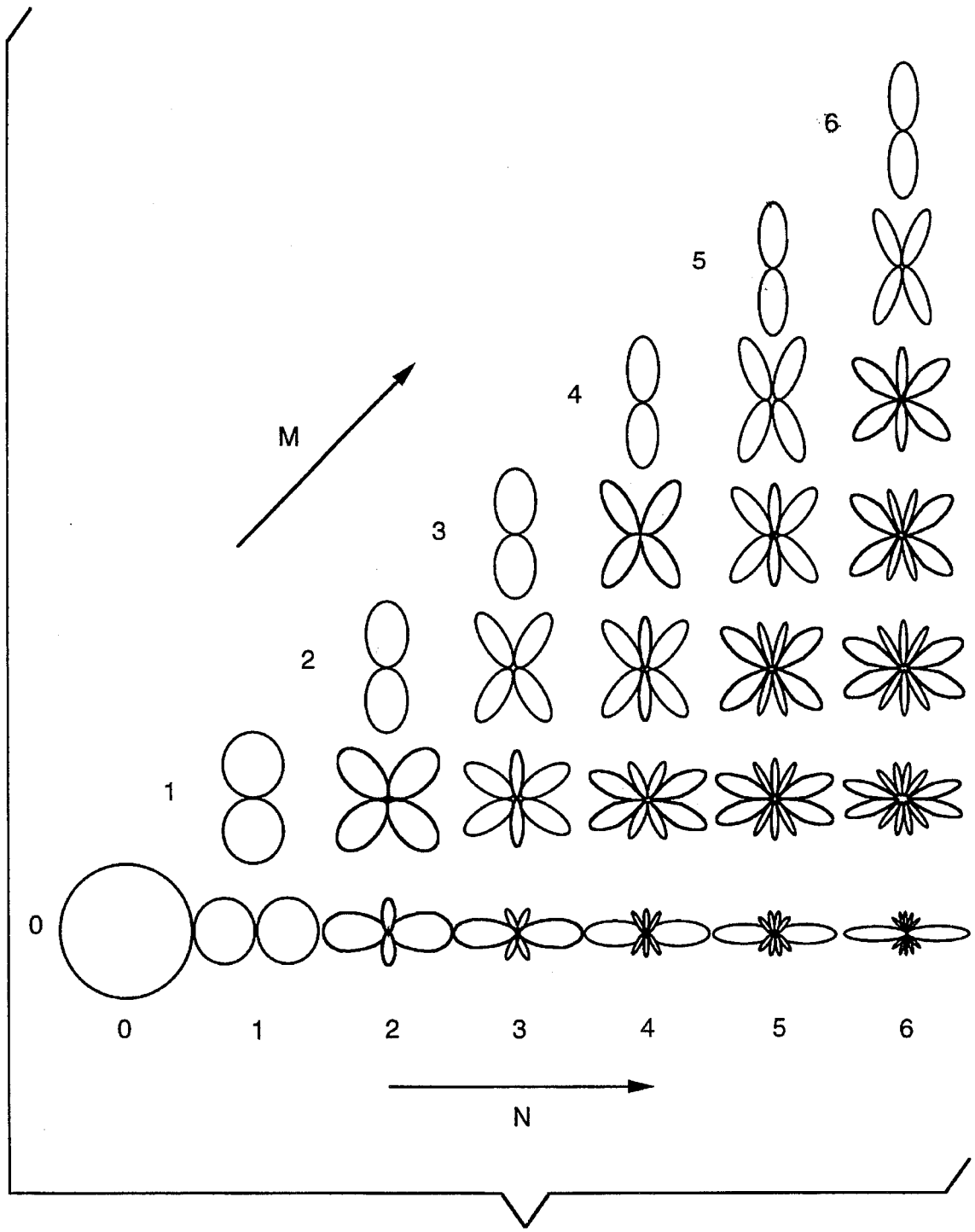
FIG. 2 is a simplified two-dimensional representation of the shape of terms of the Legendre polynomials, which is an example of a 3-dimensional polynomial representing the magnetic fields produced by the shim coils.

The homogeneity of the polarizing magnetic field $B_0$ may be improved by shim coils, as are known in the art. Such coils may be axis-symmetric with the z or bore axis, or transverse to the z or bore axis. The axis-symmetric coils are generally wound around a coil form coaxial with the magnet bore tube while the transverse coils are generally disposed in a "saddle" shape on the surface of a coil form. A shim coil may be designed to produce a magnetic field substantially corresponding to one term of a general 3D infinite series of polynomials. The 3D polynomials may be Legendre polynomials or spherical harmonic equations modeling the magnetic field $B_0$ centered at the isocenter of the magnet. A shim coil may also produce a magnetic field described by several terms of the spherical harmonic polynomials, or elliptical integrals expressed in the coordinate system with at least one radial dimension and may be used to correct inhomogeneities described by several terms. Among the lowest order shim coils are those which produce a linear gradient along one axis, described by the lowest index values of N, M (above the DC term N=0, M=0) of the 3D polynomials. A simplified, two-dimensional representation of shape of the terms of the 3-dimensional Legendre polynomials is shown in FIG. 2.

Correction of the polarizing field $B_o$ involves passing currents through each of the individual shim coil currents so that the combined magnetic fields of the shim coils balance variations in the polarizing field $B_o$ to minimize the inhomogeneities. This procedure is often referred to as shimming. Therefore, a map of the magnetic field inhomogeneities must be matched to the collective magnetic fields produced by the shim coils to determine the currents to be passed through each shim coil to minimize magnetic field inhomogeneities in the imaging volume.

Creating the Inhomogeneity Map

In an MR imaging pulse sequence, the RF excitation pulse used has a frequency bandwidth which is wide enough to excite nuclei of the subject. For example, when performing proton MR imaging, the hydrogen, $^1H$, resonance frequency of water and lipid, or fat, are the primary signal sources. These two species produce a very good MR response signal since they are abundant in humans and animals.

If a third major proton resonance may be present such as silicone, such as when breast implants are present. The excitation RF bandwidth must also encompass the silicone resonance frequency. Additionally, if inhomogeneities are present, the RF bandwidth must be expanded to encompass these as well.

A pulse sequence is applied to cause a first MR response signal, $S_1$, to be acquired from a plane through the subject. This signal is sampled, and a readout gradient is applied at a time such that the MR response signals from fat and water nuclei are in phase (or out of phase), constructively (or destructively) interfering to produce the composite signal $S_1$.

A second MR response signal $S_2$, either from a second readout gradient at a later time, or from a second pulse sequence with readout window shifted (known in the art as Dixon imaging described in patent '371), the effective echo time is (TE+τ) or (TE−τ). $S_2$ is sampled such that the fat Signal and the water signal are out of phase (or in phase) causing the MR response signals from fat and water nuclei to destructively (or constructively) interfere and to produce the MR response signal $S_2$.

By realizing that the magnitude of signals $S_1$ and $S_2$ $$S_{1mag}=mag\{(MR\ signal\ of\ water)+(MR\ signal\ of\ fat)\}\ and$$

$$S_{2mag}=mag\{(MR\ signal\ of\ water)-(MR\ signal\ of\ fat)\},$$

It can be seen by subtracting the first MR response signal magnitude $S_{1mag}$ from the second MR response signal magnitude $S_{2mag}$ results in a signal being twice that of the fat signal. By adding the second MR response signal magnitude $S_{2mag}$ and $S_{1mag}$ results in an MR magnitude being twice that of the water signal.

Likewise, complex signals contain phase information $S_1 = (MR\ signal\ of\ water + MR\ signal\ of\ fat)_e{}^{i\phi_1}$ $S_2 = (MR\ signal\ of\ water - MR\ signal\ of\ fat)_e{}^{i\phi_2}$ $\phi_2 = \phi_1 + \Delta v \tau + \tau/T_2$ where $\phi_1$, $\phi_2$ are the phases of $S_1$ and $S_2$, respectively, $\tau$ is a time delay between acquisition of MR response signals $S_1$ and $S_2$, and $T_2$ is spin-spin relaxation time as conventionally defined in MR imaging.

Since, $\tau$ is very small compared to $T_2$, this term can be dropped leaving the phase difference $\phi_2 - \phi_1 = \Delta v \tau$ representing the phase evolution owing to magnetic field inhomogeneity over time $\tau$.

The variations of the phase difference in the MR response signals at a given 3D location then indicates the inhomogeneity of the magnet at that location. Since these are complex signals and the phase evolution is related to the magnetic field the resonant nuclei experience, the phase evolution between a first acquisition of an MR response signal and a second indicate the inhomogeneity at the spatial location at which they were imaged. Since the time between acquisition of the two signals, $\tau$, is known, the difference in phase can be normalized to a difference in frequency for each location within the magnet $$\Delta v = \frac{\Delta \phi}{\tau}.$$

The imaging procedure is then repeated for different planes in the imaging volume and results in an inhomogeneity map [I]. The inhomogeneity map [I] has a $\Delta v$ at each measured 3D location which is proportional to the magnetic field inhomogeneity at that location.

In order to successfully determine magnetic field inhomogeneity described by higher order terms of the 3D infinite series polynomials, the planes from which signals are acquired, must pass through some of the lobes of the regions as shown by example in FIG. 2 for which correction is desired.

Derivative of the Inhomogeneity Map

The phase angle may be determined with an arcTangent (aTan) function. The aTan function has a range of $-\pi$ to $+\pi$ and therefore if the field inhomogeneity is larger than $$\pm \frac{1}{2\tau},$$

$\Delta \phi$ "wraps around". The measured inhomogeneity will be restricted to the range $$-\frac{1}{2\tau} < \Delta v < +\frac{1}{2\tau}.$$

Wrap around may be detected and corrected by taking the spatial partial derivatives of the measured inhomogeneity map.

The use of radial spatial derivatives, using the independent variable, $\rho$, (or r in cylindrical coordinate system) allows for detection of $\Delta \phi$ wrap around points, while maintaining the original 3D spatial representation of the Legendre polynomials in cylindrical, spherical or elliptical coordinate systems, which will be employed later in describing the magnetic field inhomogeneity. The wrap around must be taken into account in determining the actual frequency offset, as described in U.S. Pat. Nos. 4,987,371, Glover et al., and 5,168,232 Glover et al., both assigned to the present assignee and hereby incorporated by reference.

A partial derivative [dI] of the magnetic field inhomogeneity map measurements [I] (phase difference measurements over 3D space) is then determined with respect to $\rho$ for spherical or elliptical coordinates (or r for cylindrical coordinates). For example, the change in magnetic field inhomogeneity is determined with the change in $\rho$, where $\rho$ is a measure from an isocenter of the main magnet.

The derivative of the inhomogeneity map [dI] is used to determine what currents should be passed through the shim coils to correct the inhomogeneity.

In the past, Cartesian coordinates were used to correct the two lowest order Legendre polynomial terms using a 2D McLaurin expansion.

In the present invention, general 3D infinite series polynomials in cylindrical, spherical, or elliptical coordinate systems are used to model the shim coil magnetic fields solve for high order polynomial terms, and determine compensation currents.

Mathematical Representation of Shim Coil Fields

The general 3D infinite series polynomials are first expressed is in a coordinate system having at least one radial dimension (cylindrical, spherical, or elliptical). A partial derivative of the terms of the 3D polynomials are performed with respect to the independent, separable radial variable, (r, $\rho$ or $\rho$, respectively). Below are Legendre polynomial terms expressed in spherical coordinates, and their corresponding radial derivatives (with respect to $\rho$):

(N, M are index variables in the general Legendre polynomial equation.)

TABLE 1

| N,M | | spatial derivative with respect to $\rho$ |
|---|---|---|
| | even cosine terms | |
| 0,0 | 1 | 0 |
| 1,0 | $\rho \cos(\theta)$ | $\cos(\theta)$ |
| 1,1 | $-\rho \cos(\phi) \sin(\theta)$ | $-\cos(\phi) \sin(\theta)$ |
| 2,0 | $\frac{1}{4} \rho^2 (1 + 3\cos(2\theta))$ | $\frac{1}{2} \rho (1 + 3\cos(2\theta))$ |
| 2,1 | $-3\rho^2 \cos(\phi) \cos(\theta) \sin(\theta)$ | $-6\rho \cos(\phi) \cos(\theta) \sin(\theta)$ |

TABLE 1-continued

| N,M | | spatial derivative with respect to $\rho$ |
|---|---|---|
| 2,2 | $3\rho^2 \cos(2\phi)\sin^2(\theta)$ | $6\rho \cos(2\phi)\sin^2(\theta)$ |
| 3,0 | $\frac{1}{2} \rho^3(-3\cos(\theta) + 5\cos^3(\theta))$ | $\frac{3}{2} \rho^2(-3\cos(\theta) + 5\cos^3(\theta))$ |
| 3,1 | $\frac{3}{2} \rho^3 \cos(\phi)(1 - 5\cos^2(\theta))\sin(\theta)$ | $\frac{9}{2} \rho^2 \cos(\phi)(1 - 5\cos^2(\theta))\sin(\theta)$ |
| 3,2 | $15\rho^3 \cos(2\phi)\cos(\theta)\sin^2(\theta)$ | $45\rho^2 \cos(2\phi)\cos(\theta)\sin^2(\theta)$ |
| 3,3 | $-15\rho^3 \cos(3\phi)\sin^3(\theta)$ | $-45\rho^2 \cos(3\phi)\sin^3(\theta)$ |
| 4,0 | $\frac{1}{8} \rho^4(3 - 30\cos^2(\theta) + 35\cos^4(\theta))$ | |
| 4,0 deriv. | | $\frac{1}{2} \rho^3(3 - 30\cos^2(\theta) + 35\cos^4(\theta))$ |
| 4,1 | $\frac{5}{2} \rho^4 \cos(\phi)\{3\cos(\theta) - 7\cos^3(\theta)\}\sin(\theta)$ | |
| 4,1 deriv. | | $10\rho^3 \cos(\phi)\{3\cos(\theta) - 7\cos^3(\theta)\}\sin(\theta)$ |
| 5,0 | $\frac{1}{8} \rho^5(15\cos(\theta) - 70\cos^3(\theta) + 63\cos^5(\theta))$ | |
| 5,0 deriv. | | $\frac{5}{8} \rho^4(15\cos(\theta) - 70\cos^3(\theta) + 63\cos^5(\theta))$ |
| 5,1 | $\frac{15}{8} \rho^5 \cos(\phi)(-1 + 14\cos^2(\theta) - 21\cos^4(\theta))\sin(\theta)$ | |
| 5,1 deriv. | | $\frac{75}{8} \rho^4 \cos(\phi)(-1 + 14\cos^2(\theta) - 21\cos^4(\theta))\sin(\theta)$ |
| odd sine terms | | |
| 1,0 | 0 | 0 |
| 1,1 | $-\rho \sin(\phi)\sin(\theta)$ | $-\sin(\phi)\sin(\theta)$ |
| 2,0 | 0 | 0 |
| 2,1 | $-3\rho^2 \cos(\theta)\sin(\phi)\sin(\theta)$ | $-6\rho \cos(\theta)\sin(\phi)\sin(\theta)$ |
| 2,2 | $-3\rho^2 \sin(2\phi)\sin^2(\theta)$ | $-6\rho \sin(2\phi)\sin^2(\theta)$ |
| 3,0 | 0 | 0 |
| 3,1 | $\frac{3}{2} \rho^3(1 - 5\cos^2(\theta))\sin(\phi)\sin(\theta)$ | $\frac{9}{2} \rho^2(1 - 5\cos^2(\theta))\sin(\phi)\sin(\theta)$ |
| 3,2 | $15\rho^3 \cos(\theta)\sin(2\phi)\sin^2(\theta)$ | $45\rho^2 \cos(\theta)\sin(2\phi)\sin^2(\theta)$ |
| 3,3 | $-15\rho^3 \sin(3\phi)\sin^3(\theta)$ | $-45\rho^2 \sin(3\phi)\sin^3(\theta)$ |
| 4,0 | 0 | 0 |
| 4,1 | $\frac{5}{2} \rho^4(3\cos(\theta) - 7\cos^3(\theta))\sin(\phi)\sin(\theta)$ | |
| 4,1 deriv. | | $10\rho^3 (3\cos(\theta) - 7\cos^3(\theta))\sin(\phi)\sin(\theta)$ |
| 5,0 | 0 | 0 |
| 5,1 | $\frac{15}{8} \rho^5(-1 + 14\cos^2(\theta) - 21\cos^4(\theta))\sin(\phi)\sin(\theta)$ | |
| 5,1 deriv. | | $\frac{75}{8} \rho^4(-1 + 14\cos^2(\theta) - 21\cos^4(\theta))\sin(\phi)\sin(\theta)$ |

Calibration

Only one time per magnet is it required to build a calibration matrix. This is performed by passing a constant, known current though each shim coil. The magnetic field produced is measured over the imaging volume. These measurements are then fit to the partial derivative terms of the 3D Legendre polynomials using least squares or comparable known methods, resulting in the derivative shim coil calibration matrix coefficients (Table 1). A derivative shim coil calibration matrix [dM] is constructed having rows which represent each shim coil and columns which represent each Legendre polynomial term coefficient for that shim coil. For a more detailed description of calibration matrix construction, please refer to the aforementioned U.S. Pat. Nos. 4,987,371 Glover et al. and 5,168,232 Glover et al.

This calibration procedure is repeated for every shim coil.

Shim Coil Inverse Calibration Matrix

An inverse derivative matrix [dM$^{-1}$] of the derivative shim coil calibration matrix [dM] is then calculated such that the shim coil matrix [dM] multiplied by the inverse matrix [dM$^{-1}$] is unity.

Determining Shim Coil Currents

The partial derivative of the inhomogeneity map [dI] is then fit, by appropriate means as set forth in the above referenced Glover et al. patents, to the derivatives of the 3D (Legendre) polynomial of Table 1. This results in a matrix of coefficients [$dI_c$] (being 1×number of polynomial terms) of the derivative of the inhomogeneity map.

The set of coefficients [$dI_c$] for the derivative of the polynomial of the calibration inhomogeneity map is then multiplied by the inverse of derivative matrix [$dM^{-1}$] in order to determine shim current values [C] (being number of shim coils×1), defining the currents to be applied to each calibration of the shim coils. In this manner, the most effective approximation and correction of the magnetic field inhomogeneities is performed.

Pulse Sequences

A pulse sequence, such as that described in U.S. Pat. No. 4,987,371 referenced above, may be used to acquire two sets of MR response signals differing by an evolution time x, for determining the inhomogeneity map [I]. 2 or 3 dimensional gradient recalled echo images, conventional or fast spin echo images, echo planar images, spiral acquisition images may be used or projection reconstructions. These images, may be acquired in dual echo sequences or as two separate acquisitions with different effective echo times.

The above method, and pulse sequences result in the determination of currents to be applied to the shim coils to correct not only first and second order Legendre polynomial approximations of the magnetic field inhomogeneity, but correction of successively higher order terms resulting in a more accurate approximation and greater magnetic field homogeneity. Clearer, less distorted MR images of a subject are now possible with the present invention.

While several preferred embodiments of the invention have been illustrated and described herein, it is realized that modifications and changes will occur to those skilled in the art. It is therefore to be understood that the appended claims are intended to cover all such modifications and changes as fall within the true spirit and scope of the invention.

What is claimed is:

1. A method of rapid, in-vivo shimming of a magnetic field produced by a magnet employing shim coils over a desired volume of a subject comprising the steps of:

a) acquiring an inhomogeneity map [I] indicating magnetic field intensity differences over a volume in said subject;

b) calculating a partial derivative [dL] of a generalized 3 dimensional (3D) infinite series polynomial expressed in a coordinate system having at least one radial dimension, with respect to the radial dimension;

c) determining a derivative [dI] of the inhomogeneity map [I] by calculating a change in magnetic field intensity differences with a change in the radial dimension of step (b);

d) fitting the derivative of the 3D polynomial [dL] to the derivative of the inhomogeneity map [dI] to determine coefficients of the derivative inhomogeneity map [$dI_c$];

e) acquiring a derivative calibration matrix [dM] describing the change in magnetic fields produced by each shim coil with a change in the same radial dimension as in step (b);

f) determining an inverse derivative matrix [$dM^{-1}$] such that [dM]×[$dM^{-1}$]=1;

g) multiplying coefficients of derivative inhomogeneity map [$dI_c$] by the inverse derivative matrix [$dM^{-1}$] to determine shim current values [C]; and h) passing currents determined by values [C] through the respective shim coils to produce a more homogeneous magnetic field.

2. The method of rapid, in-vivo magnet shimming of claim 1 wherein the inhomogeneity map [I] indicating magnetic field intensity differences over a volume is acquired by the steps of:

a) acquiring a magnetic resonance (MR) response signal, $S_1$, from a region of said volume described by at least one term of the generalized 3D polynomial in which both fat and water resonances are in phase;

b) acquiring a magnetic resonance (MR) response signal, $S_2$, at a time delay, $\tau$, different from when $S_1$ is acquired, from the same region as that of step (a) in which the fat and water resonances are out of phase;

c) combining MR response signals to determine phase differences $\Delta\phi$ over the magnetic field volume desired to be shimmed;

d) dividing the phase difference $\Delta\phi$ at each location by the time delay, $\tau$, to determine the frequency differences; and e) repeating steps (a)–(d) for a plurality regions through said volume to determine a plurality of frequency difference which comprise inhomogeneity map [I].

3. The method of rapid, in-vivo magnet shimming of claim 1 wherein the 3D polynomial is a Legendre polynomial expressed in a coordinate system :having at least one radial dimension which describes the magnetic field produced by each shim coil.

4. The method of rapid, in-vivo magnet shimming of claim 1 wherein the 3D polynomial is expressed in cylindrical coordinates, the derivative calibration matrix [dM] is expressed in cylindrical harmonics and describes magnetic field changes with respect to the radial dimension.

5. The method of rapid, in-vivo magnet shimming of claim 1 wherein the 3D polynomial is expressed in spherical coordinates, the derivative calibration matrix [dM] is expressed in spherical harmonics and describes magnetic field changes with respect to the radial dimension.

6. The method of rapid, in-vivo magnet shimming of claim 1 wherein the 3D polynomial is expressed in elliptical coordinates, the derivative calibration matrix [dM] is expressed in elliptical integrals and describes magnetic field changes with respect to the radial dimension.

7. The method of rapid, in-vivo magnet shimming of claim 1 wherein the step of acquiring a derivative calibration matrix [dM] comprises the steps of:

a) passing a known, constant current through a shim coil;

b) measuring the magnetic field intensity over a volume desired to be shimmed;

c) determining changes of the magnetic field measurements with a change in a radial dimension;

d) fitting the derivative of the 3D polynomial [dL] to the changes in the magnetic field measurements to determine coefficients of the derivative calibration matrix [dM].

8. A method of rapid, in-vivo shimming of a magnetic field produced by a magnet employing shim coils over a desired volume of a subject comprising the steps of:

a) acquiring a inverse derivative matrix [$dM^{-1}$] predetermined for said shim coils such that [dM]×[$dM^{-1}$]=1, where [dM] is a derivative calibration matrix describing the change in magnetic fields produced by each shim coil per unit current with a change in a radial dimension;

b) acquiring an inhomogeneity map [I] indicating magnetic field intensity differences over a volume in said subject;

c) calculating a derivative [dL] of a generalized 3 dimensional (3D) polynomial expressed in a coordinate system having at least one radial dimension, with respect to the radial dimension;

d) determining a derivative [dI] of the inhomogeneity map [I] by calculating a change in magnetic field intensity differences with a change in the radial dimension of step (b);

e) fitting the derivative of the 3D polynomial [dL] to the derivative of the inhomogeneity map [dI] to determine coefficients of the derivative inhomogeneity map [$dI_c$];

f) multiplying coefficients of derivative inhomogeneity map [$dI_c$] by the inverse derivative matrix [$dM^{-1}$] to determine shim current values [C]; and g) passing currents determined by values [C] through the respective shim coils to produce a more homogeneous magnetic field.

* * * * *